United States Patent
Vähä-Ojala et al.

(10) Patent No.: US 12,325,915 B2
(45) Date of Patent: Jun. 10, 2025

(54) SUBSTRATE PROCESSING APPARATUS AND METHOD

(71) Applicant: Picosun Oy, Espoo (FI)

(72) Inventors: Timo Vähä-Ojala, Masala (FI); Väinö Kilpi, Masala (FI); Niklas Holm, Masala (FI); Timo Malinen, Masala (FI)

(73) Assignee: Picosun Oy, Espoo (FI)

( * ) Notice: Subject to any disclaimer, the term of this patent is extended or adjusted under 35 U.S.C. 154(b) by 333 days.

(21) Appl. No.: 17/779,181

(22) PCT Filed: Nov. 25, 2020

(86) PCT No.: PCT/FI2020/050793
§ 371 (c)(1),
(2) Date: May 24, 2022

(87) PCT Pub. No.: WO2021/105560
PCT Pub. Date: Jun. 3, 2021

(65) Prior Publication Data
US 2022/0403514 A1    Dec. 22, 2022

(30) Foreign Application Priority Data

Nov. 28, 2019  (FI) ..................................... 20196029

(51) Int. Cl.
*C23C 16/455*   (2006.01)
*C23C 16/44*   (2006.01)
(Continued)

(52) U.S. Cl.
CPC .... *C23C 16/45536* (2013.01); *C23C 16/4408* (2013.01); *C23C 16/4412* (2013.01);
(Continued)

(58) Field of Classification Search
CPC ............ C23C 16/45517; C23C 16/482; C23C 16/45544; C23C 16/4412; C23C 16/545;
(Continued)

(56) References Cited

U.S. PATENT DOCUMENTS 4,801,352 A    1/1989   Piwczyk
5,229,081 A    7/1993   Suda
(Continued)

FOREIGN PATENT DOCUMENTS

CN    101589171 A    11/2009
CN    107109646 A    8/2017
(Continued)

OTHER PUBLICATIONS

China Patent Office, First Office Action, Application No. 202080081951X, Mailed Jul. 29, 2023, 5 pages.
(Continued)

*Primary Examiner* — Joseph A Miller, Jr.
(74) *Attorney, Agent, or Firm* — Espatent Oy

(57) ABSTRACT

A substrate processing apparatus, including a reaction chamber to process a substrate, a photon source to provide the reaction chamber with photons from the top side of the reaction chamber, a substrate support to support the substrate, a chemical inlet to provide the reaction chamber with a reactive chemical; and a chemical outlet to exhaust gases from the reaction chamber, the chemical outlet including a surface separating the reaction chamber from a surrounding space.

12 Claims, 6 Drawing Sheets

(51) Int. Cl.
    *C23C 16/458* (2006.01)
    *C23C 16/54* (2006.01)
(52) U.S. Cl.
    CPC .... *C23C 16/45517* (2013.01); *C23C 16/4583* (2013.01); *C23C 16/545* (2013.01)
(58) Field of Classification Search
    CPC .......... C23C 16/4408; C23C 16/45536; C23C 16/4583
    See application file for complete search history.

(56) References Cited

U.S. PATENT DOCUMENTS

| | | | |
|---|---|---|---|
| 6,030,460 | A | 2/2000 | Sukharev |
| 9,252,024 | B2 | 2/2016 | Lam et al. |
| 10,597,778 | B2 | 3/2020 | Malinen |
| 10,619,241 | B2 | 4/2020 | Malinen et al. |
| 2003/0047133 | A1* | 3/2003 | Lim ............... C23C 16/488 118/50.1 |
| 2007/0259111 | A1 | 11/2007 | Singh et al. |
| 2008/0170226 | A1* | 7/2008 | Moriya ............. G01N 15/1404 73/28.01 |
| 2009/0165715 | A1 | 7/2009 | Oh |
| 2010/0037820 | A1 | 2/2010 | Lee |
| 2014/0273504 | A1 | 9/2014 | Nainani et al. |
| 2015/0292085 | A1 | 10/2015 | Baisl et al. |
| 2016/0258057 | A1 | 9/2016 | Lee et al. |

FOREIGN PATENT DOCUMENTS

| | | |
|---|---|---|
| CN | 109457234 A | 3/2019 |
| JP | S6021381 A | 2/1985 |
| JP | S6154041 A | 3/1986 |
| JP | H01502149 A | 7/1989 |
| JP | H01240665 A | 9/1989 |
| JP | H04236780 A | 8/1992 |
| JP | H06235068 A | 8/1994 |
| JP | H07300678 A | 11/1995 |
| JP | 2000309885 A | 11/2000 |
| JP | 2016506013 A | 2/2016 |
| KR | 1020080092787 A | 10/2008 |
| KR | 20180068637 A | 6/2018 |
| WO | 8805211 A1 | 7/1988 |
| WO | 9118129 A1 | 11/1991 |
| WO | 2016102749 A1 | 6/2016 |

OTHER PUBLICATIONS

China Patent Office, Search Report, Application No. 202080081951X, Mailed Jul. 24, 2023, 3 pages.
Finnish Patent and Registration Office, Search Report, Application No. 20196029, Mailed Jun. 24, 2020, 1 page.
Henke et al, "Flash-Enhanced Atomic Layer Deposition: Basics, Opportunities, Review, and Principal Studies on the flash-Enhanced Growth of Thin Films", ECS Journal of Solid State Science and Technology, 4(7) p. 277-p. 287, 2015, 12 pages.
Notification of Transmittal of the International Search Report and the Written Opinion of the International Searching Authority, or the Declaration, Application No. PCT/FI2020/050793, Mailed Jan. 28, 2021, 13 pages.

* cited by examiner

SUBSTRATE PROCESSING APPARATUS AND METHOD

FIELD

The aspects of the disclosed embodiments generally relates to substrate processing methods and apparatus. More particularly, but not exclusively, the disclosed embodiments relate to photon-enhanced atomic layer deposition (ALD) reactors.

BACKGROUND

This section illustrates useful background information without admission of any technique described herein representative of the state of the art.

In chemical deposition methods, such as atomic layer deposition (ALD), light can be used to provide required additional energy for surface reactions. The use of a light source, however, may cause certain requirements or specific problems for the deposition reactor. For example, in reactors in which light is provided into a reaction chamber through a window, the window gets easily contaminated.

SUMMARY

It is an object of certain embodiments of the present disclosure to cope with the above-identified problem or with other problem(s) or at least to provide an alternative solution to existing technology.

According to a first example aspect of the disclosed embodiments there is provided a substrate processing apparatus, comprising:

a reaction chamber to process a rollable substrate, or a substrate supported by a substrate support;

a photon source to provide the reaction chamber with photons from the top side of the reaction chamber;

a chemical inlet to provide the reaction chamber with a reactive chemical; and a chemical outlet to exhaust gases from the reaction chamber, the chemical outlet separating the reaction chamber from a surrounding space.

In certain embodiments, the chemical outlet in itself separates the reaction chamber from the surrounding space. In certain embodiments, the chemical outlet comprises a structure or surface that separates the reaction chamber from the surrounding space. In certain embodiments, the chemical outlet further provides a gap between the reaction chamber and the surrounding space.

In certain embodiments, the apparatus comprises a window in between the photon source (or a photon emitting element comprised by the photon source) and the reaction chamber.

In certain embodiments, the apparatus comprises the window in between the photon source and the reaction chamber allowing said photons to pass through, the apparatus being further configured to provide a purge flow to purge a reaction chamber side of the window.

In certain embodiments, the window in between the reaction chamber and the photon source comprises at least one coating to filter at least part of a radiated photon spectrum (radiated by the photon source). In certain embodiments, the window is provided with at least one separate filter element adjustable to filter at least part of the radiated photon spectrum. In certain embodiments, the photon spectrum, after filtering, reaching the reaction chamber has at least one narrow spectral range (such as over 90% of transmitted radiation energy within wave lengths in the range of 100 nm or 150-170 nm, for example). In certain embodiments, the photon spectrum after filtering, has a plurality of separated spectral ranges. In certain embodiments, the plurality of separated spectral ranges is defined by preferred chemistry of the process chemicals and the substrate.

In certain embodiments, the apparatus comprises:

an outer chamber (at least partly) surrounding the reaction chamber defining an intermediate space; and an intermediate space inlet to provide a gas flow into the intermediate space.

In certain embodiments, the intermediate space forms the said surrounding space.

In certain embodiments, the apparatus provides for a gas route from the intermediate space inlet to the chemical outlet. Accordingly, the chemical outlet sucks chemical from both the reaction chamber and from the intermediate space (surrounding space). In certain embodiments, the chemical outlet sucks chemical from both the reaction chamber and from the intermediate space (surrounding space) through the gap.

In certain embodiments, the substrate support is configured to move the substrate horizontally through the reaction chamber.

In certain embodiments, the substrate support is configured to adjust a vertical position of the substrate.

In certain embodiments, the apparatus comprises a shutter to control or alter the access of photons onto a surface of the substrate.

In certain embodiments, the apparatus comprises:

a protective chemical inlet to provide a protective chemical flow into a cavity in between the photon source and the window.

In certain embodiments, a pressure prevailing in the cavity is greater than an ambient pressure.

In certain embodiments, the apparatus comprises a padding part between the window and a window fastening collar.

In certain embodiments, the window is purged from both sides of the window (i.e., reaction chamber side (or lower side) and ambient (or lower) pressure side (or upper side)).

In certain embodiments, the apparatus comprises a turbomolecular pump in an exhaust line of the reaction chamber, and a flow adjustment device in a parallel line originating from the reaction chamber, by-passing the turbomolecular pump, and joining the exhaust line downstream of the turbomolecular pump.

In certain embodiments, there is provided an apparatus wherein the substrate extends from the reaction chamber over the chemical outlets into the surrounding space, the substrate being a rollable substrate (roll-to-roll substrate), such as a movable substrate web or foil, and the apparatus is configured to perform chemical reactions only in the area of the substrate that is within the limits of the reaction chamber.

According to a second example aspect of the disclosed embodiments there is provided a method, comprising:

providing a rollable substrate, or a substrate supported by a substrate support in a reaction chamber;

providing the reaction chamber with photons from the top side of the reaction chamber;

providing the reaction chamber with a reactive chemical; and exhausting gases from the reaction chamber via a chemical outlet, the chemical outlet separating the reaction chamber from a surrounding space.

In certain embodiments, the chemical outlet separates the reaction chamber from the surrounding space so that the reaction chamber resides on a first side of the chemical outlet and the surrounding space on the other or opposite side.

In certain embodiments, the method comprises:
allowing photons to pass through a window in between the photon source and the reaction chamber; and
purging a reaction chamber side of the window by a purge flow.

In certain embodiments, the method comprises:
providing an outer chamber, at least partly, surrounding the reaction chamber to define an intermediate space; and
providing a gas flow into the intermediate space.

In certain embodiments, the method comprises:
providing a gas route from the intermediate space inlet to the chemical outlet.

In certain embodiments, the method comprises:
moving the substrate horizontally through the reaction chamber by a substrate support.

In certain embodiments, the method comprises:
adjusting a vertical position of the substrate by the substrate support.

In certain embodiments, the method comprises:
controlling or altering the access of photons onto a surface of the substrate by a shutter.

In certain embodiments, the method comprises:
providing a protective chemical flow into a cavity in between the photon source and the window.

In certain embodiments, the method comprises:
providing a first route from the reaction chamber to an exhaust via a turbomolecular pump and a second route from the reaction chamber to the exhaust via a flow adjustment device in a parallel line by-passing the turbomolecular pump.

In certain embodiments, the method comprises:
adjusting a level of vacuum in the reaction chamber by selecting one of the said first and second routes to be used for gas exhaust.

In certain embodiments, the method comprises providing the rollable substrate (roll-to-roll substrate), such as a movable substrate web or foil, extending from the reaction chamber over the chemical outlets into the surrounding space, and
performing chemical reactions in the area of the substrate that is within the limits of the reaction chamber.

In certain embodiments, the method comprises:
performing sequential self-saturating surface reactions on a substrate surface in the reaction chamber.

According to further example aspect of the disclosed embodiments there is provided a substrate processing apparatus, comprising:
a reaction chamber to process a substrate;
a photon source to provide the reaction chamber with photons from the top side of the reaction chamber;
a substrate support to support the substrate;
a chemical inlet to provide the reaction chamber with a reactive chemical; and
a chemical outlet to exhaust gases from the reaction chamber, the chemical outlet separating the reaction chamber from a surrounding space.

According to a yet further example aspect of the disclosed embodiments there is provided a method, comprising:
supporting a substrate in a reaction chamber;
providing the reaction chamber with photons from the top side of the reaction chamber;
providing the reaction chamber with a reactive chemical; and
exhausting gases from the reaction chamber via a chemical outlet, the chemical outlet separating the reaction chamber from a surrounding space.

Different non-binding example aspects and embodiments have been illustrated in the foregoing. The above embodiments are used merely to explain selected aspects or steps that may be utilized in implementations of the present disclosed embodiments. Some embodiments may be presented only with reference to certain example aspects. It should be appreciated that corresponding embodiments apply to other example aspects as well. Any appropriate combinations of the embodiments may be formed.

BRIEF DESCRIPTION OF THE DRAWINGS

The disclosed embodiments will now be described, by way of example only, with reference to the accompanying drawings, in which.

DETAILED DESCRIPTION

In the following description, Atomic Layer Deposition (ALD) technology is used as an example.

The basics of an ALD growth mechanism are known to a skilled person. ALD is a special chemical deposition method based on sequential introduction of at least two reactive precursor species to at least one substrate. A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. Or, as for plasma-assisted ALD, for example PEALD (plasma-enhanced atomic layer deposition), or for photon-assisted ALD discussed herein one or more of the deposition steps can be assisted by providing required additional energy for surface reactions through plasma or photon in-feed, respectively. Or one of the reactive precursors can be substituted by energy (such as mere photons), leading to single precursor ALD processes. Accordingly, the pulse and purge sequence may be different depending on each particular case. The deposition cycles form a timed deposition sequence that is controlled by a logic unit or a microprocessor. Thin films grown by ALD are dense, pinhole free and have uniform thickness.

As for substrate processing steps, the at least one substrate is typically exposed to temporally separated precursor pulses in a reaction vessel (or chamber) to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-assisted or photon-enhanced Atomic Layer Deposition (known also as flash enhanced ALD or photo-ALD).

However, the disclosed embodiments is not limited to ALD technology, but it can be exploited in a wide variety of substrate processing apparatuses, for example, in Chemical Vapor Deposition (CVD) reactors, or in etching reactors, such as in Atomic Layer Etching (ALE) reactors.

Figure 1:
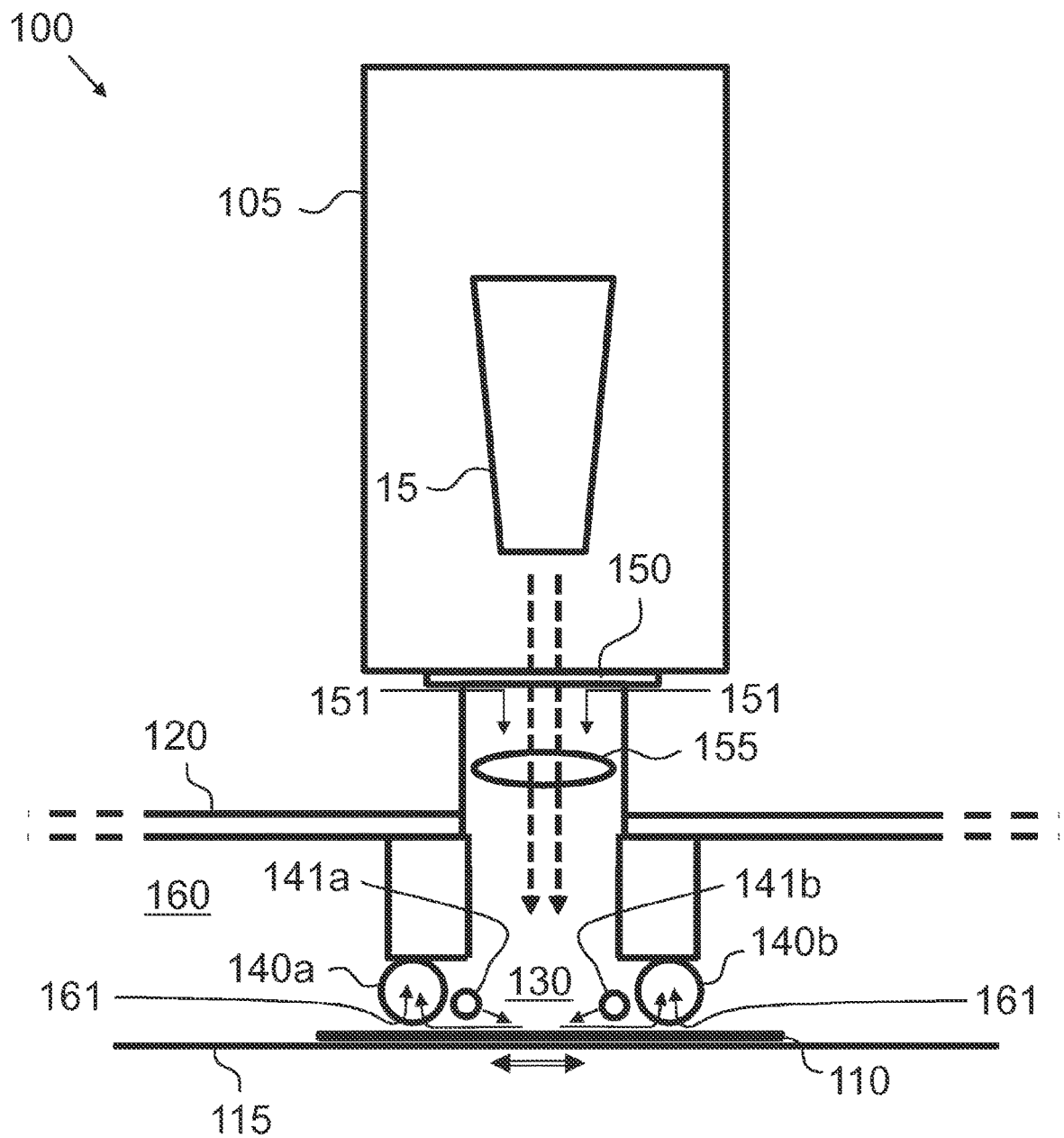
FIG. 1 shows a schematic cross section of an apparatus in accordance with certain embodiments.

FIG. 1 shows a schematic cross section of an apparatus 100 in accordance with certain embodiments. The apparatus 100 is a substrate processing apparatus which may be, for example, a photon-assisted ALD reactor. In certain embodiments, the apparatus 100 comprises a reaction chamber 130, a photon source 105, a substrate support (or holder) 115, at least one chemical inlet 141a, 141b, and at least one chemical outlet 140a, 140b.

A substrate 110 is supported by the substrate support 115. In certain embodiments, the substrate support 115 is configured to move the substrate 110 horizontally as indicated by the double headed arrow in FIG. 1. Said moving may concern either moving the substrate during loading and unloading or moving the substrate in the reaction chamber 130 during processing. The substrate 110 in certain embodiments is a planar substrate or a wafer. In certain embodiments, the substrate support 115 is configured to move the substrate 110 vertically. In certain embodiments, the substrate support 115 is configured to move the substrate 110 horizontally and vertically.

The chemical inlet 141a provides the reaction chamber 130 with a reactive chemical. In certain embodiments, the chemical inlet 141a is in the form of a channel or tubular structure. In certain embodiments, the chemical inlet 141a extends horizontally within the reaction chamber 130. In certain embodiments, the chemical inlet 141a extends horizontally above a surface of the substrate 110 that is exposed to the reactive chemical. In certain embodiments, the chemical inlet comprises one or more apertures pointing towards the substrate surface. Said pointing towards the surface may be from an oblique angle. In certain embodiments, the chemical inlet 141a is spaced apart from reaction chamber walls.

The chemical outlet 140a provides the reaction chamber 130 with chemical exhaust. In certain embodiments, the chemical outlet 140a is in the form of a channel or tubular structure. In certain embodiments, the chemical outlet 140a extends horizontally at a side of the reaction chamber 130. In certain embodiments, the chemical outlet 140a comprises a surface separating the reaction chamber 130 from a surrounding space. In certain embodiments, the surface of the chemical outlet 140a forms a complete reaction chamber side wall or forms part of a reaction chamber side wall. The surrounding space may be an intermediate space 160 formed in between the reaction chamber 130 and a wall or walls of a surrounding vacuum chamber 120. In certain embodiments, during substrate processing, the intermediate space 160 has a pressure higher than the pressure of the reaction chamber 130.

In certain embodiments, the apparatus 100 comprises a gap in between the chemical outlet 140a and the substrate support 115 (or other (or another) lower counter surface, for example, the substrate 110). In certain embodiments, the substrate support 115 has a cavity to match the shape of the substrate 110 so as to provide that the gap remains constant. In other words, in certain embodiments, an upper surface of the substrate support 115 and an upper surface of the substrate reside at a same level when the substrate lies in the cavity. In certain embodiments, the gap extends horizontally forming a horizontal slit at a side (or side corner) of the reaction chamber 130. The chemical outlet 140a comprises an aperture or a set of apertures facing the gap. In certain embodiments, the aperture(s) is/are located at a bottom surface of the chemical outlet 140a. In certain embodiments, the aperture(s) extend(s) throughout a total (horizontal) length of the gap. In certain embodiments, the aperture(s) are at least partly arranged to other directions than towards the substrate. In certain embodiments, a pump connected to the chemical outlet 140a sucks chemicals from both the reaction chamber 130 and from the other side of the gap, i.e., from the surrounding space (or intermediate space 160) into the chemical outlet 140a via the gap. The latter flow is depicted by arrow 161 in FIG. 1. Due to pressure difference between the reaction chamber 130 and the surrounding space, chemicals from the reaction chamber 130 are prevented from entering the surrounding space. Accordingly, the pressure within the surrounding space provides a counter pressure and/or the flow (inactive gas flow) from the surrounding space to the gap provides a counter flow preventing the chemicals from leaking from the reaction chamber 130.

The apparatus 100 in certain embodiments comprises more than one chemical inlet, for example, the inlet 141a and a corresponding chemical inlet 141b as shown in FIG. 1. The other chemical inlet 141b may be symmetrically positioned with respect to the chemical inlet 141a and the reaction chamber 130. In FIG. 1 the inlet 141b is positioned opposite to the inlet 141a. The inlet 141a may provide the reaction chamber 130 with a first reactive chemical, and the inlet 141b another reactive chemical.

Similarly, the apparatus 100 in certain embodiments comprises a more than one chemical outlet, for example, the outlet 140a and a corresponding chemical outlet 140b as shown in FIG. 1. The outlets 140a,b may be positioned at respective opposite sides of the reaction chamber 130.

In certain embodiments, the photon source 105 provides the reaction chamber 130 with photons from the top side of the reaction chamber 130. The photon source 105 comprises a photon emitting element 15 that emits photons. The electromagnetic radiation used may be light, such as ultraviolet (UV) light, or radiation with other wavelength. A suitable photon emitting element 15, such as an UV lamp, is selected correspondingly.

In certain embodiments, the photons emitted by the photon emitting element 15 travel through a window 150 into a vertical channel that leads towards the substrate 110 positioned within the reaction chamber 130. In certain embodiments, the photon emitting element 15 is positioned on an ambient pressure side of the window 150 whereas vacuum conditions prevail the other side of the window 150.

In certain embodiments, the window 150 in between the reaction chamber 130 and the photon source 105 comprises at least one coating (not shown) to filter at least part of a radiated photon spectrum range (radiated by the photon source 105). In certain embodiments, the window 150 is provided with at least one separate filter element (not shown) adjustable to filter at least part of the radiated photon spectrum range. In certain embodiments, the photon spectrum range, after filtering, reaching the reaction chamber 130 has at least one narrow spectral range (such as over 90% of transmitted radiation energy within wave lengths in the range of 100 nm or 150-170 nm, for example). Accordingly, the apparatus 100 is configured to provide the reaction chamber 130 with photons having at least one narrow spectral range in certain embodiments. In certain embodiments, the photon spectrum after filtering, has a plurality of separated spectral ranges. Accordingly, the apparatus 100 is configured to provide the reaction chamber 130 with photons having at least one narrow spectral range in those embodiments. In certain embodiments, the plurality of separated spectral ranges is defined by preferred chemistry of the process chemicals and the substrate 110.

In certain embodiments, a shutter 155 is positioned in between the window 150 and the substrate 110. The shutter is used to control the area on the substrate surface that sees the emitted photons. In certain embodiments, the shutter 155 is positioned within the vertical channel. In certain embodiments, the vertical channel travels through an upper wall of the vacuum chamber 120. In certain embodiments, the shutter 155 is adapted to block out at least part of the spectrum emitted by the photon source 105.

In certain embodiments, a reaction chamber side of the window 150 is purged by a purge flow. Accordingly, during substrate processing the apparatus is configured to provide a purge flow to purge the reaction chamber side of the window 150. In certain embodiments, the purge flow enters the reaction chamber side surface of the window 150 from side(s) as depicted by arrow(s) 151 in FIG. 1. The flow direction then turns (downwards) towards the substrate 110 and the purge flow exits the reaction chamber 130 via the aforementioned gap (into the chemical outlet(s) 140a,b).

During substrate processing, the substrate 110 is processed within the reaction chamber 130 as desired, such as by ALD. For example, the substrate surface may be alternately exposed to
- a first reactive chemical and a second (another) reactive chemical;
- a first reactive chemical and a second reactive chemical complemented by photon exposure; or
- a first reactive chemical and photon exposure (single precursor process).

Figure 5:
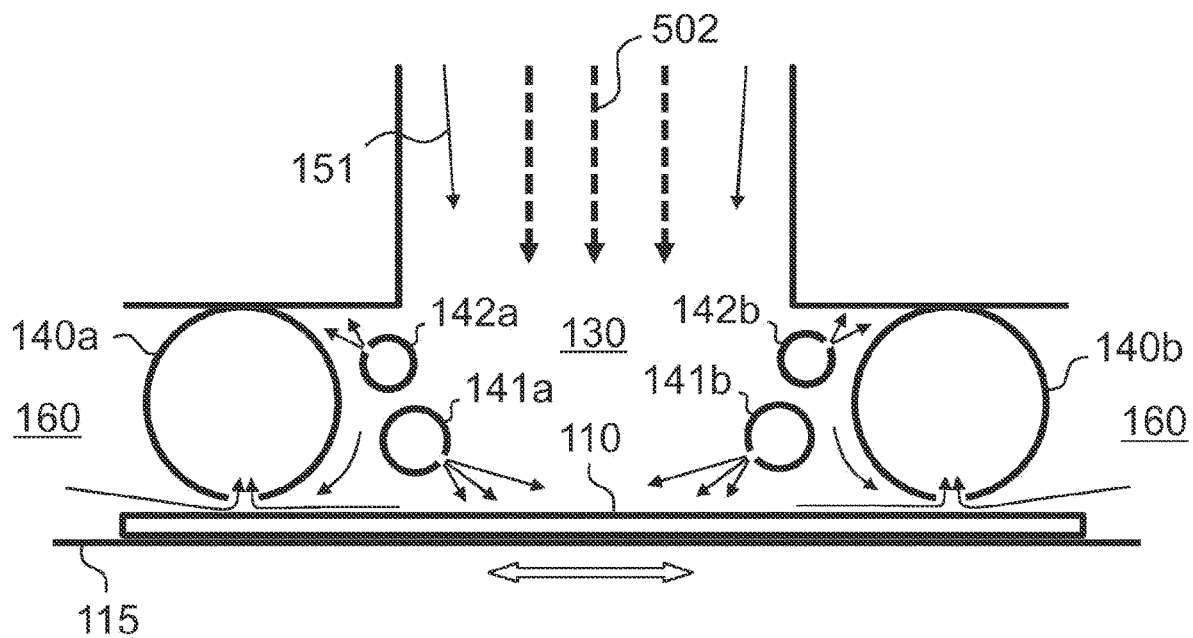
FIG. 5 shows a schematic cross section of a reaction chamber in accordance with certain embodiments.

During processing, the substrate 110 may reside completely within the reaction chamber 130 or, optionally, extend over the aforementioned gap(s) as shown in FIG. 1. In the latter case the chemical reactions (e.g., deposition) may occur only at the area that is at the time period in question within the limits of the reaction chamber 130. One such an exemplary configuration is a roll-to-roll deposition reactor (not shown), which has rolls on both sides of the reacting chamber 130 (e.g., an unwind roll and a rewind roll). For such and any other applicable systems the part 115 that in FIGS. 1 and 5 represents a substrate holder 115 may actually represent a rollable substrate, such as a movable substrate web or foil.

In certain embodiments, the reaction chamber 130, and optionally also the vacuum chamber 120, is heated or cooled by a suitable heating or cooling equipment (not shown). Such heating or cooling means in certain embodiments comprise thermal insulation in between the equipment and outside of the heated space.

Figure 2:
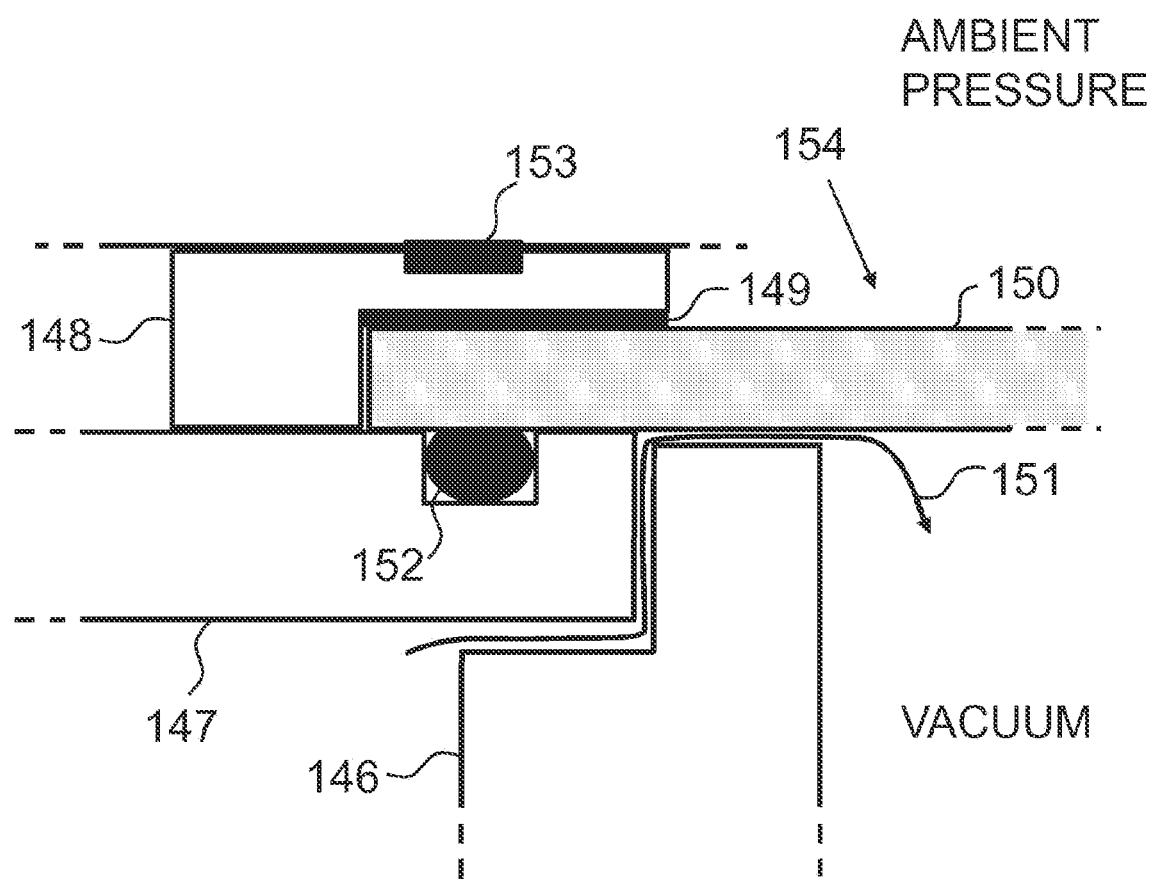
FIG. 2 shows a window protective flow in accordance with certain embodiments.

FIG. 2 shows a window protective flow (the aforementioned purge flow) in accordance with certain embodiments. As mentioned, the apparatus 100 in certain embodiments comprises a window 150 in between the photon emitting element 15 and the substrate 110 (or reaction chamber 130). In a practical embodiment, the window 150 separates a vacuum pressure side of the apparatus 100 from an ambient pressure side. The window 150 is fastened by pressing the window 150 from its upper (or ambient pressure) side by a frame part 148 against a sealing surface. In certain embodiments, the sealing surface is provided by a counterpart 147 (a body part or similar) that resides on the other side (or vacuum pressure side) of the window 150. In certain embodiments, the counterpart 147 comprises a groove and a seal (e.g., o-ring seal) 152 in the groove. In certain embodiments, the apparatus comprises a protective flow guiding part 146 positioned under the window 150 (or on the vacuum pressure side of the window 150). In certain embodiments, the protective flow guiding part 146 guides a purge flow 151 onto the reaction chamber side surface of the window 150. In certain embodiments, the parts 146-148 are made of metal.

In certain embodiments, a padding part 149 is positioned in between the window 150 and the frame part (or collar) 148. In certain embodiments, the padding part 149 is a soft and/or elastic metal part, for example, a soft metal alloy part. Suitable material for the padding part 149 is, for example, EN-AW 1050 aluminum that is a very soft allow. The purpose of the padding part 149 is to smooth the stress experienced by the window 150.

On the ambient pressure side of the window 150 the frame part 148 is sealed against a part next to it (e.g., an upper body part) by a suitable sealing method. For example, the frame part 148 may have a groove with a seal 153 positioned in it.

In certain embodiments, there is formed a cavity 154 in between the window 150 and the photon emitting element 15 (element 15 is not shown in FIG. 2). The cavity 154 is on the ambient pressure side of the window 150 and its lower part is defined by the upper side of the window 150.

Figure 3:
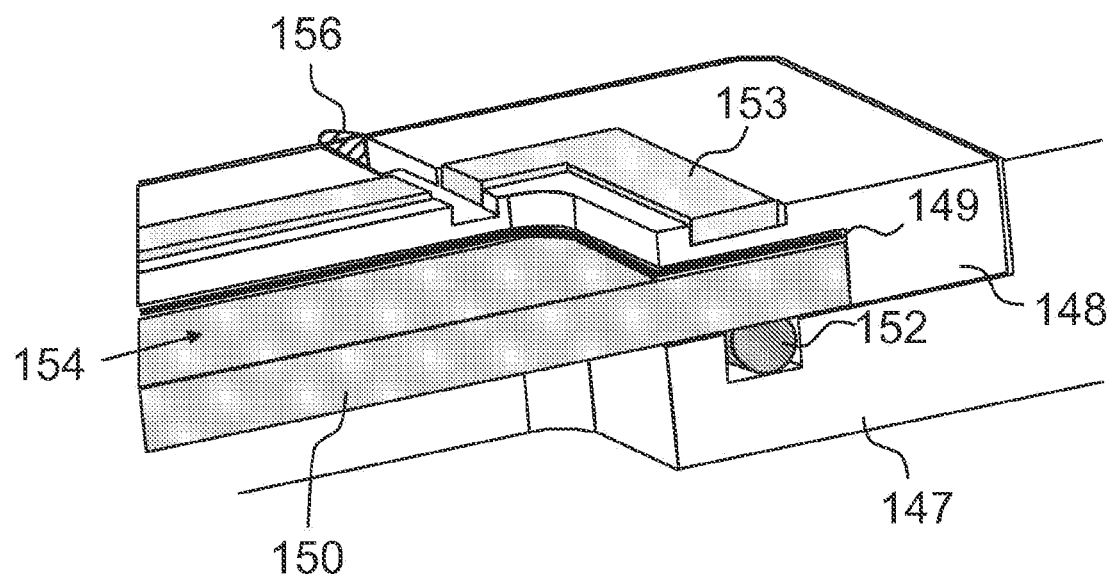
FIG. 3 shows a perspective view of certain parts of an apparatus in accordance with certain embodiments.
Figure 4:
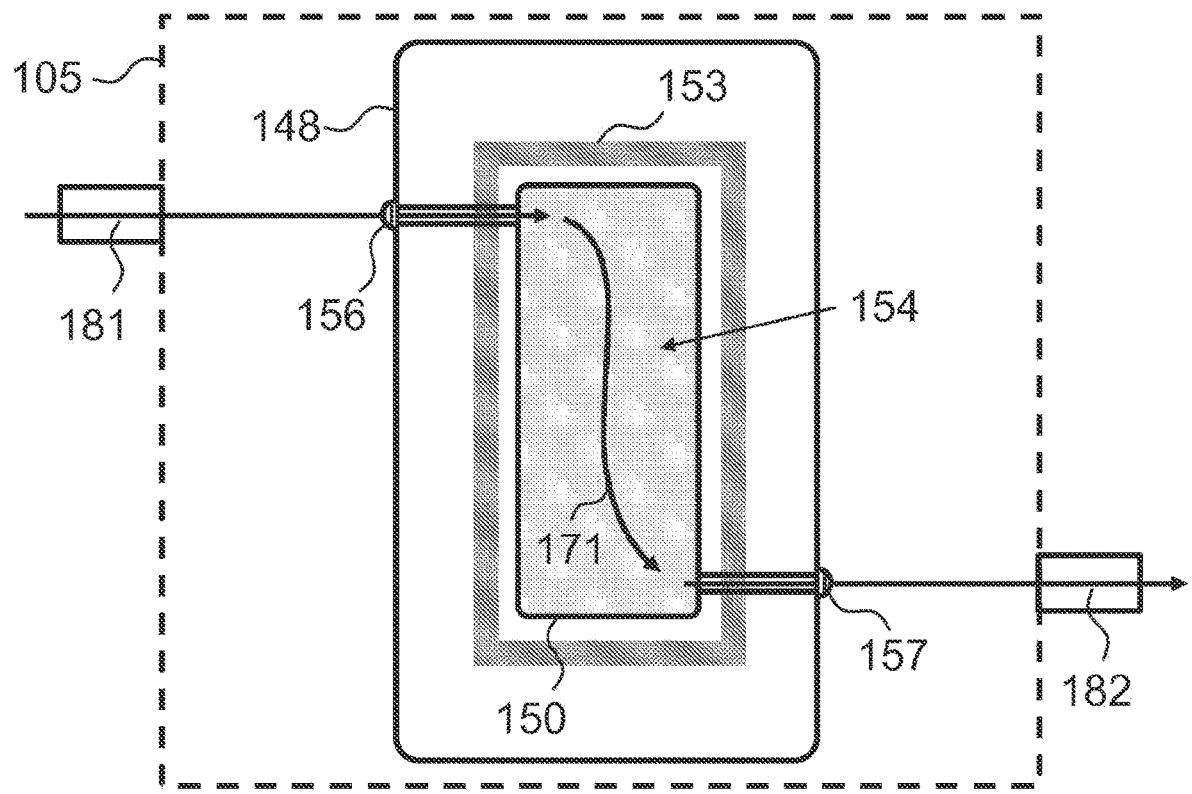
FIG. 4 shows certain purge flow directions in accordance with certain embodiments.

The cavity 154 is further shown in FIGS. 3 and 4. Inactive gas (e.g., nitrogen) is fed into via a first fitting 181 into a channel (first channel) that passes through the frame part 148. The channel ends at the cavity 154. In certain embodiments, the flow rate in the channel is adjusted by an adjustment device 156 (e.g., an adjustable orifice) attached to the channel (or comprised by the channel). The inactive gas flows across the cavity 154 from a cavity inlet to a cavity outlet purging the ambient pressure side surface of the window 150 on its way. In certain embodiments, the flow across the cavity occurs in a diagonal direction of the cavity as depicted by arrow 171. A second channel begins at the cavity outlet. The second channel passes through the frame part 148. It exits the photon source 105 via a second fitting 182. In certain embodiments, the flow rate in the second channel is adjusted by a second adjustment device 157 (an adjustable orifice or similar) attached to the second channel (or comprised by the second channel).

In certain embodiments, the pressure within the cavity 154 is kept on a higher level compared to the ambient pressure (room pressure) so as to prevent surrounding air from leaking into the cavity 154. In certain embodiments, the pressure in the cavity 154 is adjusted by the adjustment devices 156 and 157. For example, in certain embodiments, a pressure raise in the cavity 154 is obtained by allowing more inactive gas to enter the cavity 154 compared to inactive gas exiting the cavity 154.

FIG. 5 shows an enlargement of the apparatus of the type shown in FIG. 1 in the area of the reaction chamber 130 in accordance with certain embodiments. A reference is made to the description of FIG. 1 as to the general structure and operation of the apparatus.

The chemical inlets 141a, 141b comprise one or more apertures pointing towards the surface of the substrate 110. The aperture(s) may be implemented by directional hole(s). In certain embodiments, the chemical inlets 141a, 141b are rotatable to adjust the angle at which the aperture(s) point at the substrate surface. FIG. 5 shows additional chemical inlets 142a and 142b. The additional chemical inlets 142a and 142b may basically correspond to the structure and operation of the chemical inlets 141a and 141b. In certain embodiments, as depicted in FIG. 5, the additional chemical inlets 142a and 142b have apertures or directional holes to flow inactive gas towards corners of the reaction chamber 130 in order to purge said corners. The chemical outlets 140a, 140b suck chemicals from both the reaction chamber 130 and from the intermediate space 160. The incoming photons are depicted by arrows 502.

Figure 6:
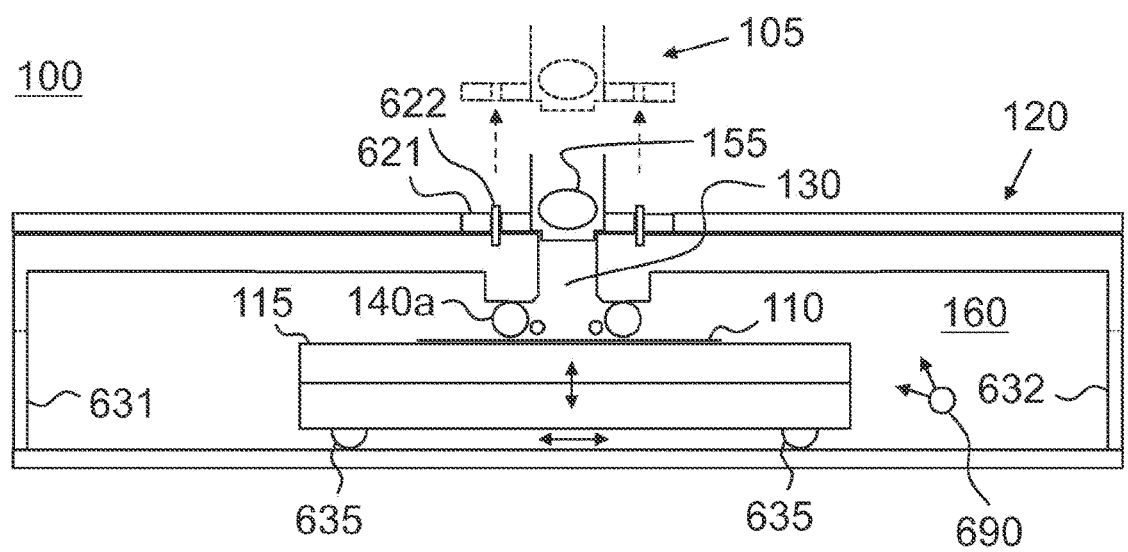
FIG. 6 shows another schematic cross section of an apparatus in accordance with certain embodiments.

FIG. 6 shows another schematic cross section of an apparatus 100 in accordance with certain embodiments. The apparatus 100 comprises the substrate support 115 in the form of a carriage. The substrate 110 is supported on the top side of the substrate support 115. In certain embodiments, the substrate support comprises at least one moving element 635, such as wheel(s) to horizontally move the substrate support as well as the substrate 110.

In certain embodiments, the substrate support 115 comprises a height adjustment (for example, screw(s) inside of the substrate support structure) depicted by the vertical double headed arrow in FIG. 6. In certain embodiments, the size of the gap in between the chemical outlet 140a and the substrate support 115 is adjusted by the height adjustment.

In certain embodiments, the substrate support 115 comprises an intermediate space inlet 690 to flow inactive gas (as depicted by arrows) into the intermediate space 160. This gas exits the intermediate space 160 via the mentioned gap(s) into the chemical outlet(s) 140a/b. In other embodiments, an intermediate space inlet is additionally or alternatively arranged in another position, for example, in a wall of the vacuum chamber 120.

In certain embodiments, the substrate 110 (or a plurality of substrates 110) is loaded into the intermediate space 160 or into the reaction chamber 130 via a port 631 arranged in a wall of the vacuum chamber 120. The substrate(s) 110 may be loaded onto the substrate support via said port 631, or the whole carriage supporting the substrate(s) may be loaded via said port 631. Unloading may occur via the same port 631 or via another port, for example via port 632 which may be arranged in an opposite wall of the vacuum chamber 120. In case of the roll-to-roll deposition reactor, the rollable substrate may travel via said ports 631, 632.

In certain embodiments, the substrate support resides on the outside of the reaction chamber 130. In certain embodiments, the substrate support 115 only forms a bottom surface of the reaction chamber 130. By a horizontal movement of the substrate support 115 in the intermediate space 160 the substrate 110 is horizontally moved in the reaction chamber 130.

In certain embodiments, the photon source 105 is detachably attached to the apparatus or to the vacuum chamber (lid) structures. In certain embodiments, the apparatus 100 or photon source 105 comprises an attachment part 621 and fastening means 622, such as screws or bolts. In certain embodiments, the photon source 105 is detachable in a vertical direction (upwards) for service.

Figure 7:
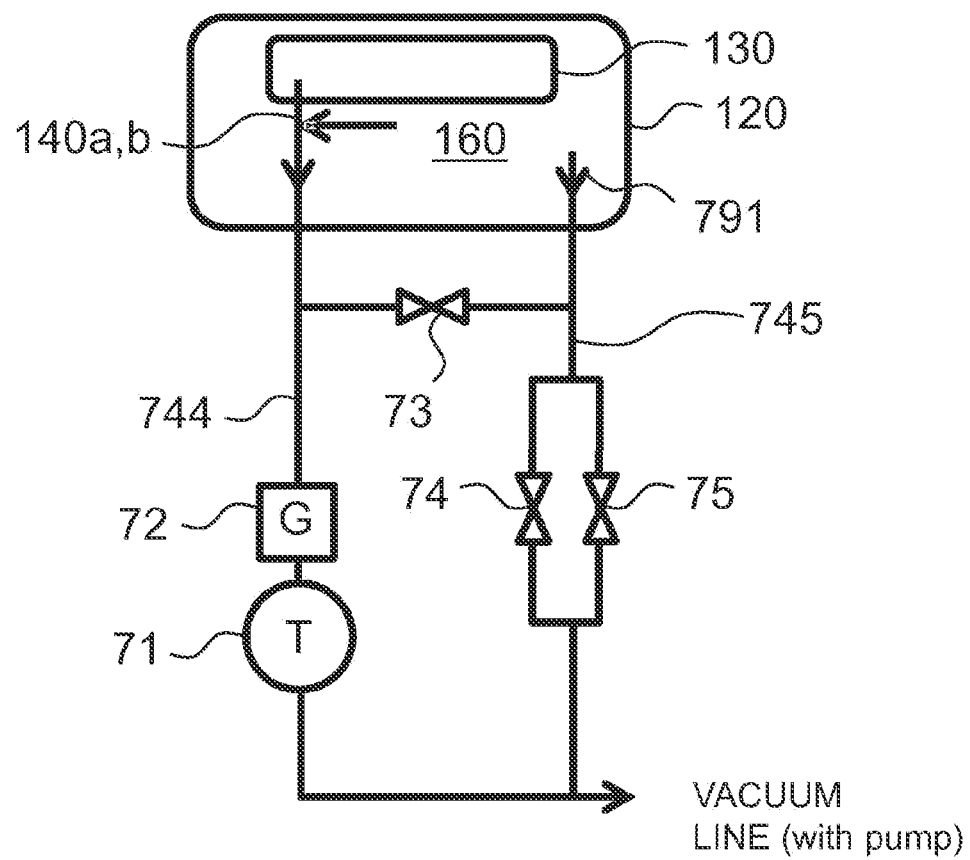
FIG. 7 shows a schematic drawing of an exhaust line arrangement in accordance with certain embodiments.

FIG. 7 shows a schematic drawing of an exhaust line arrangement in accordance with certain embodiments. An exhaust line system that exits chemicals from the reaction chamber 130 and from the intermediate space 160 may commence in the form of chemical outlet(s) 140a and 140b from the reaction chamber 130 and intermediate space 160, and a separate optional outlet 791 from the intermediate space 160. In certain embodiments, the outlets 140a and 140b represent kind of pump tubes along which the chemicals flow away from the reaction chamber 130 and intermediate space 160. In certain embodiments, the exhaust line system branches to two parallel lines 744 and 745. The outlets 140a,b from the reaction chamber 130 extend to the first branch 744. In certain embodiments, the optional outlet 791 extends to the second branch 745. The branch 744 has a vacuum pump, preferably a turbomolecular pump 71. The branch 745 has two valves in parallel (valves 74 and 75). In certain embodiments, the branches 744 and 745 are separated (before any pump, or before the pump 71) by a valve 73. In certain embodiments, the valves 74 and 75 are used to open and close the branch 745 as desired. In certain embodiments, the valve 74 is restricted or at least partly restricted. Due to the valve 74 being restricted, in certain embodiments, when operated at different pressure regions the evacuation of the reaction chamber 130 and intermediate space 160 can be made more even than with just one valve. The line 744 in certain embodiments has a flow adjustment device 72, such as, a gate valve. In certain embodiments, the flow adjustment device 72 is positioned upstream of the pump 71. Downstream of the elements 71-75, the branches 744 and 745 rejoin and continue as a vacuum line in certain embodiments (in certain embodiments, there is a pump or vacuum pump further away in the vacuum line). In certain embodiments, the valve 73 is used to prevent chemical backflow (by closing it). In certain embodiments, the valve 73 is used to (be opening it) to enable (faster) pump down by using outlets 140a,b and optionally 791 before the (turbomolecular) pump 71 has been turned on. At that time, the flow via the branch 744 may be restricted or closed by the flow adjustment device 72.

In certain embodiments, a first route from the reaction chamber 130 to the vacuum line is provided via the (turbomolecular) pump 71 and a second route from the reaction chamber 130 to the vacuum line is provided via flow adjustment devices or valves 74 and/or 75 in a parallel line by-passing the turbomolecular pump 71. In certain embodiments, a level of vacuum in the reaction chamber is adjusted by selecting one of the mentioned routes. In certain embodiments, upon starting the (turbomolecular) pump 71, the gate valve 72 is opened and valves 73, 74 and 75 are closed.

Without limiting the scope and interpretation of the patent claims, certain technical effects of one or more of the example embodiments disclosed herein are listed in the following. A technical effect is providing ALD reactions in low pressures. A further technical effect is protecting the window between the photon source and reaction chamber or path of photons from the photon source to the reaction chamber from exposure of deglaciating gases. A further technical effect is forming a reaction space on a moving substrate by defining the intermediate space and the reaction chamber by (or with) a point which is connected to a pump line. The pump line in certain embodiments is a turbomolecular pump line to enable better evacuation of the reaction space required for a photo-ALD process. A further technical effect is adjusting a chemical flow from chemical inlets to different directions to direct the chemical flow towards the substrate (s), but away from the window so as to optimize a photo- ALD process. A further technical effect is protecting the window on both sides of the window by purging both sides of the window.

The foregoing description has provided by way of non-limiting examples of particular implementations and embodiments of the present disclosure a full and informative description of the best mode presently contemplated by the inventors for carrying out the disclosed embodiments. It is however clear to a person skilled in the art that the disclosed embodiments is not restricted to details of the embodiments presented above, but that it can be implemented in other embodiments using equivalent means without deviating from the characteristics of the disclosed embodiments.

Furthermore, some of the features of the above-disclosed embodiments of this present disclosure may be used to advantage without the corresponding use of other features. As such, the foregoing description should be considered as merely illustrative of the principles of the present disclosure, and not in limitation thereof. Hence, the scope of the disclosed embodiments is only restricted by the appended patent claims.

The invention claimed is:

1. A substrate processing apparatus, comprising:
   a reaction chamber to process a roll-to-roll substrate, or a substrate supported by a substrate support;
   a photon source to provide the reaction chamber with photons from the top side of the reaction chamber;
   a chemical inlet to provide the reaction chamber with a reactive chemical;
   a chemical outlet to exhaust gases from the reaction chamber, the chemical outlet separating the reaction chamber from a surrounding space, and
   a window in between the photon source and the reaction chamber allowing said photons to pass through, the apparatus being further configured to provide a purge flow to purge a reaction chamber side of the window, wherein the chemical inlet is positioned between the chemical outlet and the location where the purge flow is configured to be introduced to the reaction chamber.

2. The apparatus of claim 1, comprising:
   an outer chamber surrounding the reaction chamber defining an intermediate space; and
   an intermediate space inlet to provide a gas flow into the intermediate space.

3. The apparatus of claim 2, where the apparatus provides for a gas route from the intermediate space inlet to the chemical outlet.

4. The apparatus of claim 1, where the substrate support is configured to move a substrate horizontally through the reaction chamber.

5. The apparatus of claim 4, where the substrate support is configured to adjust a vertical position of a substrate.

6. The apparatus of claim 1, comprising a shutter to control or alter the access of photons onto a surface of a substrate.

7. The apparatus of claim 1, comprising:
   a protective chemical inlet to provide a protective chemical flow into a cavity in between the photon source and the window.

8. The apparatus of claim 7, wherein a pressure prevailing in the cavity is greater than an ambient pressure.

9. The apparatus of claim 1, comprising a padding part between the window and a window fastening collar.

10. The apparatus of claim 1, comprising a turbomolecular pump in an exhaust line of the reaction chamber, and a flow adjustment device in a parallel line originating from the reaction chamber, by-passing the turbomolecular pump, and joining the exhaust line downstream of the turbomolecular pump.

11. The apparatus of claim 1, wherein the roll-to-roll substrate extends beyond the limits of the reaction chamber over the chemical outlets into the surrounding space, the substrate being a movable roll-to-roll substrate web or foil, and the apparatus is configured to perform chemical reactions only in the area of the substrate that is within the limits of the reaction chamber.

12. The method of claim 1, wherein the chemical outlet inhibits gas flow between the reaction chamber and the surrounding space.

* * * * *